United States Patent
Ressel et al.

(10) Patent No.: US 7,338,821 B2
(45) Date of Patent: Mar. 4, 2008

(54) METHOD FOR THE PASSIVATION OF THE MIRROR-FACES SURFACES OF OPTICAL SEMI-CONDUCTOR ELEMENTS

(75) Inventors: Peter Ressel, Berlin (DE); Gotz Erbert, Berlin (DE)

(73) Assignee: Forschungsverbund Berlin E.V., Berlin (DE)

( * ) Notice: Subject to any disclaimer, the term of this patent is extended or adjusted under 35 U.S.C. 154(b) by 305 days.

(21) Appl. No.: 10/514,276

(22) PCT Filed: May 8, 2003

(86) PCT No.: PCT/EP03/04836

§ 371 (c)(1), (2), (4) Date: May 26, 2005

(87) PCT Pub. No.: WO03/096498

PCT Pub. Date: Nov. 20, 2003

(65) Prior Publication Data
US 2005/0287693 A1    Dec. 29, 2005

(30) Foreign Application Priority Data
May 13, 2002    (DE)  ............................... 102 21 952

(51) Int. Cl.
*H01L 21/00*    (2006.01)

(52) U.S. Cl. ........................................ 438/26; 438/778
(58) Field of Classification Search ............... 438/25, 438/26, 778, 785, 786, 791
See application file for complete search history.

(56) References Cited

U.S. PATENT DOCUMENTS 5,144,634 A * 9/1992 Gasser et al. ............ 372/49.01
5,851,849 A * 12/1998 Comizzoli et al. ............ 438/38
6,734,111 B2 * 5/2004 Lindstrom et al. .......... 438/718

* cited by examiner

*Primary Examiner*—Tuan H. Nguyen
(74) *Attorney, Agent, or Firm*—Norris, McLaughlin & Marcus, PA

(57) ABSTRACT

The aim of the invention is to simplify known passivation methods. According to said method, the semi-conductor elements are heated and cleaned in a high vacuum with a gaseous, reactive low-energy medium. A closed, insulating or slightly conductive, transparent protective layer is applied in-situ, said layer being inert in relation to the material on the mirror-type surface and the remaining components of a natural oxide. In a preferred embodiment, the optical semi-conductor elements is a GaAs-based semi-conductor laser, the reactive and low-energy medium is an atomic hydrogen and the protective layer is made of ZnSe.

10 Claims, 2 Drawing Sheets

Figure 1:
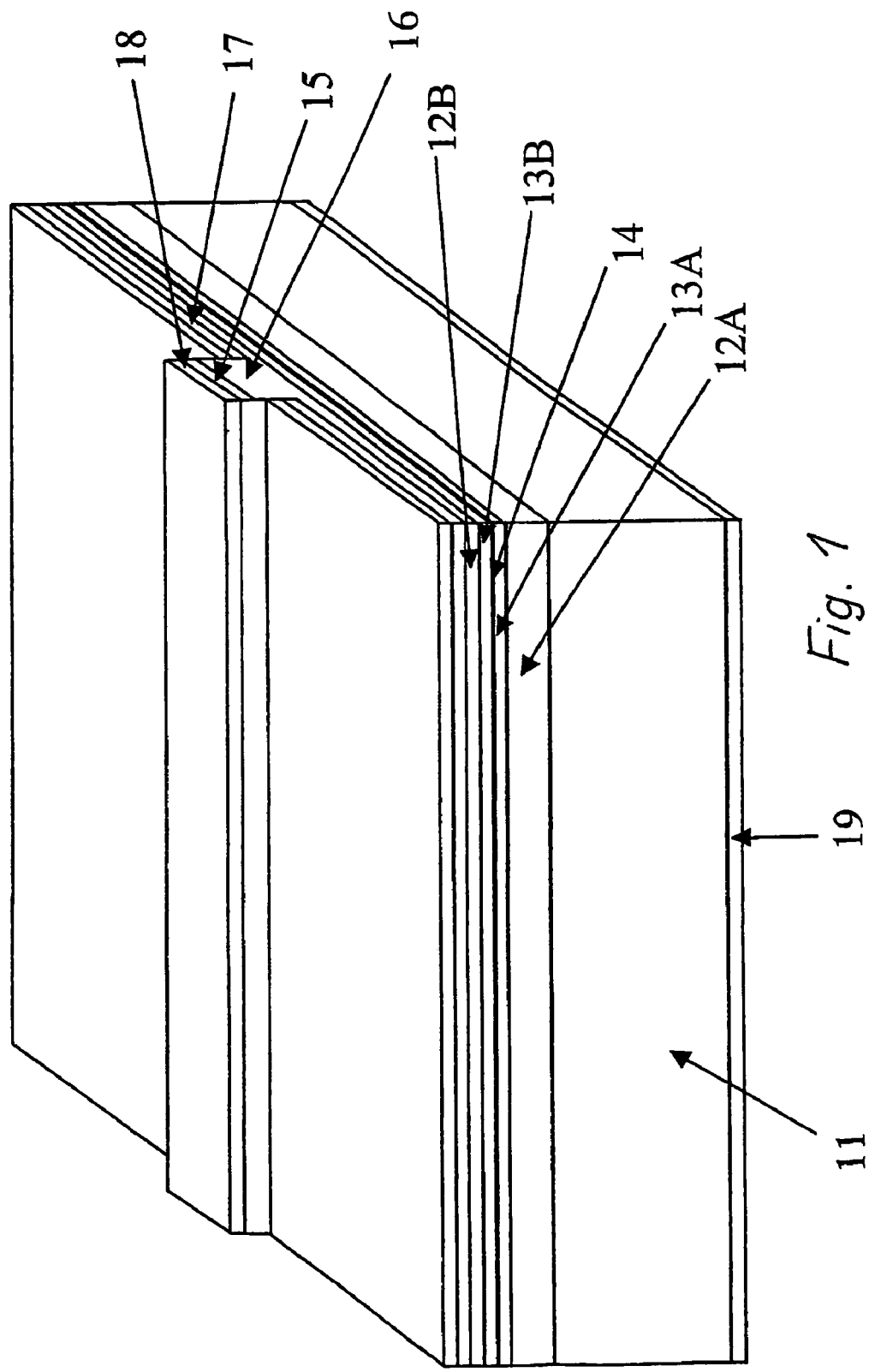

METHOD FOR THE PASSIVATION OF THE MIRROR-FACES SURFACES OF OPTICAL SEMI-CONDUCTOR ELEMENTS

BACKGROUND OF THE INVENTION

1) Field of the Invention

The invention relates to a method for passivating the mirror faces of optical semiconductor components after exposure to air. The method is most important for semiconductor lasers, but is also suitable for other semiconductor components where light exits from mirror faces, such as super-luminescent diodes, surface-emitting diode lasers and the like.

2) Description of the Related Art

Optical semiconductor components are used in many applications in different technical fields, such as optical communication, illumination, pumping of solid-state lasers, material processing or medical therapies. Their compact design and high-efficiency have advantages compared to conventional light sources. In particular, high-power semiconductor lasers have begun to gain importance in markets where their beam quality, which is still inferior to that of conventional solid-state or gas lasers, is acceptable or can be compensated by suitable measures.

Life time and maximum output power of semiconductor lasers is still limited mainly by the quality of the mirror faces. When the mirror faces are produced in the air, in particular during cleaving of the wafers into laser bars in air, a natural oxide is immediately produced, hereinafter referred to intrinsic oxide. The intrinsic oxide/semiconductor interface has a high interface state density which causes substantial non-radiative recombination. The intrinsic oxide, which contains also substances like arsenic or water, is inherently chemically much less stable than the semiconductor materials that make up the mirror faces. At high optical power densities, these factors in conjunction with the generation and migration of lattice defects, cause two known effects:

(a) a continuous rise of the operating current to maintain a constant output power (common degradation of the mirror faces), and (b) a sudden destruction of the mirror faces (catastrophic optical damage—COD), which causes a sudden component failure.

COD is the result of a rapid degradation process with a strong positive feedback, where the local heating of the mirror faces due to non-radiative recombination at defects causes a decrease in the band gap. This in turn causes a stronger heating, the process accelerates and causes within a short time a destruction of the mirror face. During operation of the component, the threshold for onset of the COD typically decreases due to gradual degradation. At some point, the output power level causing COD reaches a level less than the actual output power, so that the component fails. This situation is not fundamentally changed by depositing additional layers for adjusting the reflectivity of the mirror faces by conventional techniques, such as ion beam sputtering (IBS), plasma-enhanced chemical vapor deposition (PECVD) and the like. The intrinsic oxide, which is the main source for the gradual degradation, is merely covered by the subsequent layers. Accordingly, the optical semiconductor components, which are fabricated by the aforedescribed deposition of the layers for adjusting the reflectivity on mirror faces produced in air, are susceptive to the aforedescribed degradation effects and COD, again limiting the life time and output power of the components.

One possible solution for solving this problem is the generation of the mirror faces that are free from intrinsic oxide and contamination, or are at least free from materials that can react with the materials of the mirror faces. In the past, different methods have been proposed and investigated for realizing this concept. Such methods, which are directed to the preparation of uncontaminated mirror faces in combination with the deposition of a protective layer, will be referred to hereinafter as passivation. The published references cited hereinafter describe, for example, the development of methods for passivation and the present state of the technology.

The most effective method for producing uncontaminated mirror faces is, of course, to avoid any contact with air, which can be achieved with edge-emitting semiconductor lasers by cleaving the laser bars in a suitable environment, in particular in ultra-high vacuum. U.S. Pat. No. 5,144,634 discloses the in situ deposition of an impervious passivation layer on fresh mirror faces. In a preferred embodiment, this is achieved by electron beam evaporation of a thin layer of Si, Ge or Sb onto the mirror faces which have been produced in situ in ultra-high vacuum. A similar solution is disclosed in U.S. Pat. No. 5,171,717. Such passivated components operate reliably at powers more than twice the power of conventional components. However, cleaving the laser bars in ultra-high vacuum requires complex and expensive equipment. For this reason, passivation methods have been developed that allow cleaving in air.

U.S. Pat. No. 5,799,028 describes a passivation method that is based on the treatment of mirror faces produced in air with sulfur-containing solutions or with $H_2Se$, wherein the mirror faces are subsequently sealed with a semiconductor layer of GaP, InGaP, GaN, ZnSe, and the like. Various published references are cited that confirm that the intrinsic oxide of the mirror faces is replaced during this treatment by monolayers of sulfur and/or selenium. Such layers have a low interface state density when in contact with the semiconductor materials of the mirror faces. However, the layers are unstable in air, so that an inert protective layer of one of the afore-mentioned materials must be immediately grown epitaxially on the mirror faces.

U.S. Pat. No. 5,668,049 describes using $H_2Se$ and $H_2S$ plasma etching for removal of the intrinsic oxide on the mirror faces and for simultaneously covering the mirror faces with a thin layer of selenium or sulfur. These Se- ad/or S-layers significantly reduce the interface state density on the mirror faces and therefore further improve the cleaning effect of this plasma etching process. The Se- ad/or S-layers must be covered in situ with a protective layer to prevent a new oxidation of the cleaned faces in air. Although the effectiveness of such methods has been demonstrated, these or similar techniques can still produce radiative damage due to the interaction with energetic particles, which can at least partially cancel out the effect from cleaning of the mirror faces.

EP 10 60 545 discloses a method for passivation that is based on the growth of a single-crystalline layer on the mirror faces. If the mirror surfaces were cleaved in air, intrinsic oxide and contamination are removed before the growth of the single-crystalline layer. The single-crystalline layer is composed preferably of ZnSe, MgS or BeTe. The subsequent layers used to adjust the reflectivity are preferably also grown epitaxially on the passivation layer.

EP 10 06 629 discloses a method for increasing the life time and maximum output power of ridge waveguide semiconductor lasers. A first cleaning step for the mirror faces involves treatment with a low-energy plasma (25-300 eV).

During the growth of the passivation layer, residual oxygen is embedded into the passivation layer, stimulated by ion bombardment. In a preferred embodiment, the passivation layer is composed of amorphous silicon. Ion bombardment during the ion-beam-assisted deposition (IBAD) of the Si-layer produces the desired oxygen gettering due to $SiO_x$—formation. No Ga—O— or As—O-bonds were detected at the interface between the mirror face and the passivation layer by XPS measurements, which demonstrates the effectiveness of the passivation method.

All the aforedescribed methods lead to the desired result, i.e., an improvement of the life time and the output power of semiconductor lasers as compared with components produced without a passivation step. Nevertheless, it would be desirable to further simplify the passivation process, because the growth of single-crystalline passivation layers is complex and the use of high-energy particles for cleaning the mirror faces may cause problems by producing lattice defects. The lattice defects increase the amount of non-radiative recombination and can therefore once more limit the reliability of the component.

BRIEF SUMMARY OR THE INVENTION

It is therefore an object of the invention to provide a process for passivating optical semiconductor components to achieve longer lifetimes and higher output powers, whereby the mirror faces are to be produced in air.

The object of the invention is solved by the features of claim 1. Advantageous embodiments are recited in the dependent claims.

The method of the invention is based on a two-step process. The optical semiconductor components, whose mirror faces were exposed to air, are first introduced into a high vacuum apparatus, heated to temperatures <420° C., and cleaned by treatment with a gaseous, reactive and low-energy medium. The medium is composed of atoms or molecules which are in the ground state or in an excited state and have a kinetic energy of less than 1-2 eV. The medium can react with one or several constituents of the intrinsic oxide and with other contaminants of the mirror faces to form volatile reaction products. Preferably, atomic hydrogen is used which is produced in a separate microwave plasma. Subsequently, an impervious, insulating or low-conductivity protective layer is deposited onto the mirror faces in situ. The protective layer is composed of a material that is chemically inert with respect to the materials of the mirror faces and to any remaining components of the intrinsic oxide. The protective layer also acts as a barrier against in-diffusion of impurities from the environment, which can react with and contaminate the mirror face. The material and the thickness of the protective layer are selected so as to provide the highest possible light transparency. Advantageous, but not necessary, is a low interface state density relative to the semiconductor material. In a preferred embodiment, ZnSe is applied by thermal evaporation. Other suitable materials are $Gd_2O_3$, Si or BeTe. If the reflectivity is different from a target value, then additional layers can be deposited in situ or ex situ after passivation to adjust the reflectivity of the mirror faces.

Semiconductor lasers produced with the process of the invention exhibit improved life times and can be operated at higher output powers than lasers produced without a special passivation step. Although the results are comparable to those obtained with known passivation methods, the advantage of the invention lies in its simplicity. The mirror faces can come into contact with air, which makes cleaving of the bars in ultra-high vacuum unnecessary. No energetic particles, which could produce defects on the mirror faces, are used for cleaning the mirror faces. The cleaning temperatures are below approximately 420° C., where typical metal contacts are still thermally stable. Consequently, the metallization step can be carried out before the wafer is cleaved into bars, which also does not unnecessarily complicate the fabrication process. The protective layer also does not have to be single-crystalline, which obviates the need for using special equipment for growing epitaxial semiconductor layers or other layers. Stated differently, the method uses known, commercially available and relatively inexpensive equipment, which does not unnecessarily complicate the manufacture of the component.

BRIEF DESCRIPTION OF THE INVENTION

Figure 2:
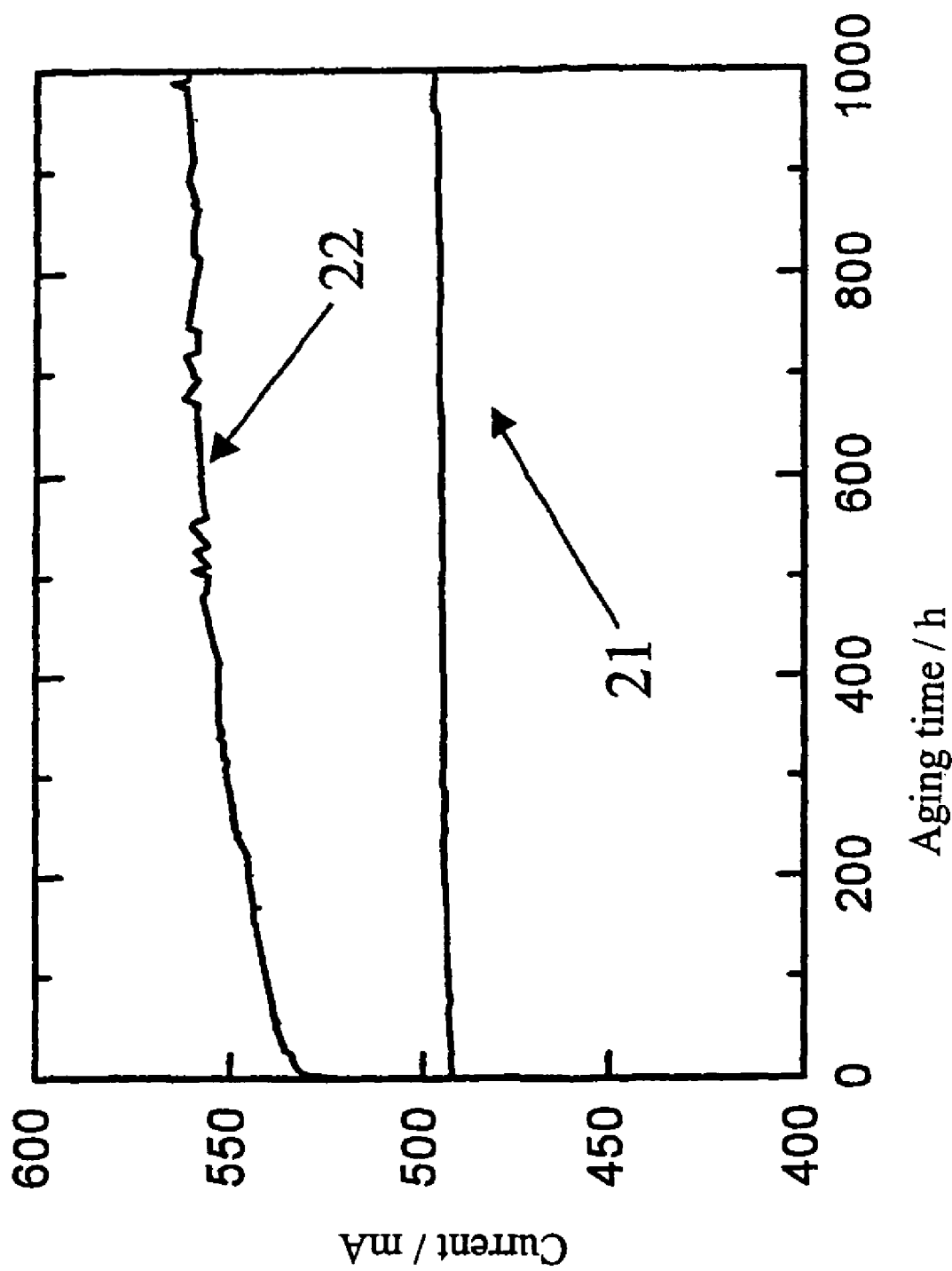

The invention will be described hereinafter with reference to an exemplary embodiment. The appended drawings show in:

FIG. 1 schematically a semiconductor lasers produced by the method of the invention; and FIG. 2 the operating current as a function of the aging time at constant optical output power for semiconductor lasers which have been produced without a passivation step and with the method of the invention.

DETAILED DESCRIPTION OF THE INVENTION

FIG. 1 shows schematically an exemplary GaAs-based semiconductor laser 10. A plurality of semiconductor layers is formed on an n-GaAs (001) substrate 11 by depositing a first cladding layer 12A (AlGaAs, InGaP, and the like), a first waveguide layer 13A (AlGaAs, InGaAsP, and the like), a first quantum well structure 14, a second waveguide layer 13B, a second cladding layer 12B, and a $p^+$-GaAs contact layer 15. A mesa 16 is etched down into the second cladding layer 12B, thereby defining the lateral dimension of the waveguide formed by the plurality of the aforedescribed semiconductor layers. An insulating layer 17 ($Al_2O_3$, $SiO_2$, and the like), a p-contact 18 and an n-contact 19 complete the multilayer structure which then forms a preformed laser structure. Other details of the layer structure are not important for the present invention and will therefore not be described.

The preformed structure is further processed by scribing and cleaving into individual bars, each consisting of a number of individual semiconductor lasers 10. Two opposite mirror faces are produced in this manner.

The preformed structures in the form of the individual laser bars are then secured in air in a suitable holder and introduced into a vacuum chamber for cleaning and sealing the mirror faces. Because mirror faces produced in air are immediately covered by a layer of an intrinsic oxide and by contaminants, such as water and the like, which limit the lifetime and output power of the semiconductor lasers, the mirror faces are cleaned and a protective layer is applied according to the invention. Cleaning is performed with a reactive, but low-energy medium. The term "low-energy" indicates that atoms or molecules of the medium have a kinetic energy not exceeding 1-2 eV. In a preferred embodiment of the method, the medium is composed of atomic hydrogen, excited or in the ground state, or of excited or molecular hydrogen. The described medium can be generated in different ways, for example by excitation and dissociation of molecular hydrogen on hot filaments or by extraction from a gas discharge in a microwave plasma, which is generally known in the art. The cleaning action of the preferred medium begins already at temperatures <420° C., so that there is no risk that the p- and n-contacts 18 and 19 degrade during cleaning. It will be understood that the effectiveness of the cleaning operation depends on the base pressure in the vacuum chamber. However, it is not necessary to operate at base pressures that are typical for the UHV-range, i.e., pressures of <1×10$^{-8}$ mbar. The vacuum chamber for cleaning and sealing the mirror faces therefore needs to be evacuated only down to pressures in the high vacuum range, preferably in a range between 1×10$^{-8}$ and 1×10$^{-7}$ mbar.

Cleaning of the mirror faces in the context of the present invention does not mean that all components of the intrinsic oxide must be removed. The method is mainly intended to produce a chemically inert mirror surface. The components of the intrinsic oxide as well as the contaminants capable of reacting with the mirror faces during the laser operation must be removed. Atomic hydrogen (and excited molecular hydrogen) are known to react at temperatures below 420° C. with oxides of As, Ga and P as well as with As or C, which are all present on mirror faces of GaAs-based semiconductor lasers produced in air. It does not affect $Al_2O_3$ which can be found in regions of the mirror faces of AlGaAs-based lasers. Mirror faces can be considered as clean within the context of the present invention if they are free from components that can cause degradation of the lasers during operation. The mirror faces may still contain inert residues from the oxidation process caused by cleaving of the laser bars in air.

The cleaned mirror faces must subsequently be protected from new oxidation or contamination. Therefore, a protective layer is preferably deposited immediately after the surfaces have been cleaned. The protective layer must be inert with respect to the adjacent semiconductor materials as well as possible remaining oxide layers and should act as a barrier against in-diffusion of contaminants from the environment. The layer must be impervious, but transparent for the laser radiation. The layer must also be insulating or have a low conductivity, so that only a small fraction of the total operating current flows across the mirror faces during operation. The layer itself can be amorphous or crystalline. Since it is no requirement to grow a single-crystalline layer, which would be impossible if the residual layer of the intrinsic oxide is amorphous, there is also no need to use expensive and complicated equipment for depositing epitaxial layers. On the contrary, standard methods can be used for layer deposition, such as thermal or electron beam evaporation or ion beam sputtering, which are not based on the direct interaction of energetic particles with the surface to be coated. If the mirror face is free of residual oxide, the material of the protective layer can advantageously also be selected to have a low interface state density relative to the semiconductor materials to be protected, thus further improving the properties of the components. A preferred material for the protective layer is ZnSe. The material is transparent for radiation across a wide spectral range, such as the spectral emission range of typical semiconductor lasers, and can be deposited from thermal sources, such as Knudsen cells, etc., which are known in the art. Preferably, ZnSe can be evaporated onto the mirror faces after cleaning, i.e. in the aforedescribed vacuum chamber, which the mirror faces are at room temperature or at another selected temperature suitable for the growth of ZnSe on III-V semiconductors. However, other materials can also be used for the protective layer, such as $Gd_2O_3$, Si or BeTe.

Thereafter, insulating or low-conductivity layers are deposited onto the mirror faces, after these have been cleaned and sealed according to the invention, to adjust the desired reflectivity. The end face that emit the light is typically coated for low reflectivity (R<30%), for example, by depositing a single layer with a low index of refraction (n<2). The backside is then coated with a high-reflectivity stack of layers (R>90%). In a preferred embodiment, the laser bars that have been passivated according to the invention are introduced into another vacuum apparatus, where the layers for adjusting the reflectivity are deposited. Ion beam sputtering is used to apply a single $Al_2O_3$ layer on the exit face for the light, whereas alternating layers of $Al_2O_3$ and $TiO_2$ are deposited on the backside. The laser bars are then removed from the vacuum chamber, scribed and separated into individual laser dies.

Ridge waveguide semiconductor lasers of the type shown in FIG. 1 that emit at a wavelength of 980 nm have been prepared experimentally in two different ways: on one hand, without a special passivation step, and on the other hand, by using the method of the invention. The reflectivity of the face where the light exits, and of the back face were adjusted to values of 1% and 95%, respectively. Laser diodes from both experimental sets were then subjected to an aging test without applying special selection criteria. The test which was carried out for 1000 hours at a temperature of 40° C., whereby the output power of the diodes was maintained at a stable value of 300 mW. FIG. 2 shows the diode current as a function of the aging time for a passivated semiconductor laser 21 and for a non-passivated semiconductor laser 22. Degradation rates for the lasers have been determined from the increase of the diode current as a function of the aging time. These rates change significantly over time for non-passivated diodes and become stable after several hundred hours at values in the range of the several 10$^{-5}$/hour. The COD level had fallen to values of 350-400 mW at the end of the test, so that an imminent failure of the diodes could be expected if the test were continued. The degradation rates of passivated diodes stabilize very quickly (within approximately 200 hours) at values of 5×10$^{-6}$/hour or less, which is an order of magnitude less than the rate for non-passivated diodes. The passivated diodes show thermal "rollover", i.e., a decrease of the output power after a critical current value is exceeded, even after conclusion of the aging test. This demonstrates that the COD level of the diodes does not change of as a result of the aging process. Both the stability of the COD level and the significantly reduced degradation rates of the passivated lasers demonstrate convincingly the superior performance of the method of the invention.

In the exemplary embodiment, the fabrication of semiconductor layers with cleaved mirror faces was described. It should be stated, however, that the method can be generally applied to other optical semiconductor components, such as super-luminescent diodes, surface-emitting diode lasers (VCSEL), and the like.

LIST OF REFERENCE CHARACTERS 10 semiconductor laser
11 GaAs(011) substrate
12A first cladding layer
13A first waveguide layer
14 Quantum well structure
13B second waveguide layer
12B second cladding layer
15 p$^+$-GaAs contact layer
16 mesa
17 insulator layer
18 p-contact
19 n-contact

The invention claimed is:

1. A method for passivating mirror faces of optical semiconductor components after exposure to air, comprising the steps of heating and cleaning the semiconductor components under high vacuum with a gaseous, reactive and low-energy medium;

depositing an impervious, insulating or low-conductivity, light-transparent protective layer in situ, wherein the protective layer is inert with respect to a material on a minor face and to remaining components of an intrinsic oxide.

2. The method according to claim 1, wherein at least one additional layer is deposited for adjusting a reflectivity.

3. The method according to claim 1, wherein a protective layer is used comprising a material selected from ZnSe, $Gd_2O_3$, Si and BeTe.

4. The method according to claim 3, the protective layer is evaporated.

5. The method according to claim 1, wherein the semiconductor components are heated for cleaning to a temperature between about 350° C. and about 420° C.

6. The method according to claim 1, wherein the semiconductor components are introduced for cleaning into a high vacuum having a pressure in a range between about $1 \times 10^{-8}$ to about $1 \times 10^{-7}$ mbar.

7. The method according to claim 1, wherein, after conclusion of the passivation, at least one layer is applied for adjusting the reflectivity, the layer comprising a material selected from one of $Al_2O_3$, $TiO_2$, $SiO_2$, $Ta_2O_5$ and Si.

8. A method for passivating mirror faces of optical semiconductor components after exposure to air, comprising the steps of heating and cleaning the semiconductor components under high vacuum with a gaseous, reactive and low-energy medium;

depositing an impervious, insulating or low-conductivity, light-transparent protective layer in situ, wherein the protective layer is inert with respect to a material on a mirror face and to remaining components of an intrinsic oxide, and wherein the gaseous, reactive and low-energy medium has a kinetic energy of less than about 2 eV.

9. The method according to claim 8, wherein the reactive medium is atomic hydrogen.

10. The method according to claim 8, wherein the reactive medium is excited molecular hydrogen.

* * * * *